United States Patent
Hoya et al.

(10) Patent No.: US 7,397,685 B2
(45) Date of Patent: Jul. 8, 2008

(54) SEMICONDUCTOR MEMORY DEVICE HAVING ERROR CHECKING AND CORRECTING CIRCUIT

(75) Inventors: Katsuhiko Hoya, Yokohama (JP);
Shinichiro Shiratake, Yokohama (JP);
Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 113 days.

(21) Appl. No.: 11/392,614

(22) Filed: Mar. 30, 2006

(65) Prior Publication Data

US 2007/0058414 A1 Mar. 15, 2007

(30) Foreign Application Priority Data

Sep. 15, 2005 (JP) .............................. 2005-269061

(51) Int. Cl.
*G11C 11/22* (2006.01)
(52) U.S. Cl. .................. 365/145; 365/200; 365/203
(58) Field of Classification Search ................ 365/145, 365/200, 203
See application file for complete search history.

(56) References Cited

U.S. PATENT DOCUMENTS

2005/0094476 A1* 5/2005 Noda .......................... 365/232

FOREIGN PATENT DOCUMENTS

JP 11-16389 1/1999
JP 2004-213719 7/2004

* cited by examiner

*Primary Examiner*—Huan Hoang
(74) *Attorney, Agent, or Firm*—Oblon, Spivak, McClelland, Maier & Neustadt, P.C.

(57) ABSTRACT

A semiconductor memory device includes a memory cell including a ferroelectric capacitor and a cell transistor and storing binary data at a first potential level and a second potential level which is higher than the first potential level, a bit line which reads the binary data from the memory cell, a correction circuit which corrects an error of the binary data read from the memory cell via the bit line, and a setting circuit which sets to the first potential a potential of the bit line connected to the memory cell from which at least the binary data is read, after the binary data is transferred to the correction circuit. The device further includes a control circuit which controls the potential of the bit line connected to the memory cell from which the binary data is read, in accordance with a result of error correction of the binary data.

18 Claims, 3 Drawing Sheets

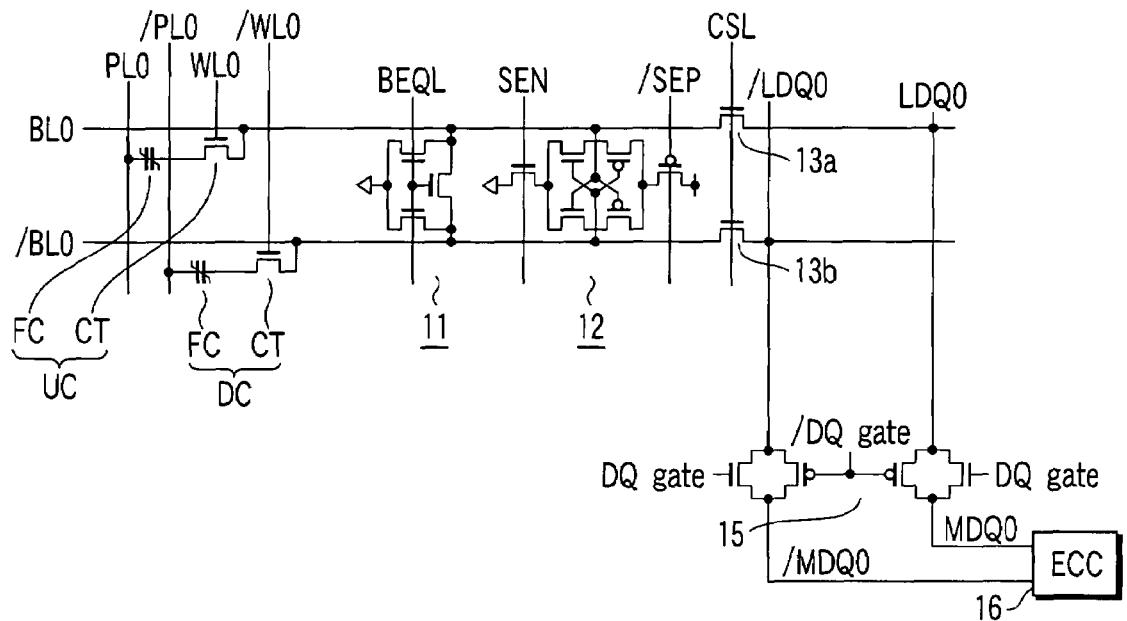
F I G. 3
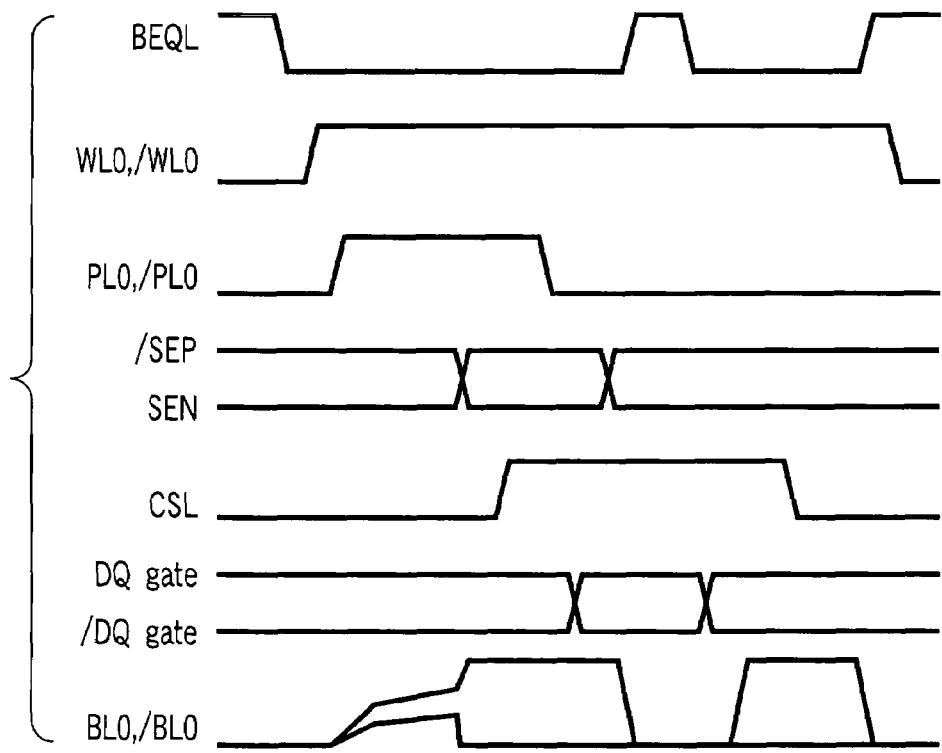
F I G. 4

US 7,397,685 B2

SEMICONDUCTOR MEMORY DEVICE HAVING ERROR CHECKING AND CORRECTING CIRCUIT

CROSS-REFERENCE TO RELATED APPLICATIONS

This application is based upon and claims the benefit of priority from prior Japanese Patent Application No. 2005-269061, filed Sep. 15, 2005, the entire contents of which are incorporated herein by reference.

BACKGROUND OF THE INVENTION

1. Field of the Invention

The present invention relates to a semiconductor memory device. More specifically, the invention relates to a ferroelectric random access memory (FeRAM) having an error checking and correcting (ECC) circuit and using a ferroelectric capacitor.

2. Description of the Related Art

Attention has recently been attracted to a ferroelectric random access memory using a ferroelectric capacitor as a nonvolatile semiconductor memory device. The ferroelectric random access memory nonvolatilely stores binary data according to the amount of different two polarizations (amount of remanent polarization) of a ferroelectric using the fact that spontaneous polarization, one of characteristics of the ferroelectric exhibits a hysteresis characteristic.

The memory cells (unit cells) of a prior art FeRAM generally adopt the same architecture as those of a dynamic random access memory (DRAM). In the prior art FeRAM, a paraelectric capacitor of the DRAM is replaced with a ferroelectric capacitor and the ferroelectric capacitor is connected in series to a cell transistor to form a unit cell. Such unit cells are arranged two-dimensionally to configure a large-capacity memory cell array.

There are two types of FeRAM. One is a so-called 2T/2C FeRAM from which data is read using two unit cells, and the other is a so-called 1T/1C FeRAM from which data is read using one unit cell.

Data is read from an FeRAM by applying a voltage to a ferroelectric capacitor and reversing the polarization. In other words, the read of data from the FeRAM is destructive read. It is thus necessary to write back the read data. In general, the compared and amplified state of read data is maintained by a sense amplifier to write data "0." Then, the potential of a plate line drops to VSS from the state to write data "1." It is more effective to write data "0" first and then data "1" as a data write-back operation.

In the above destructive-read type FeRAM, data is repeatedly written each time data is read out. Particularly in an FeRAM with an ECC circuit, read data is written back in accordance with the results of error correction and correct data can be written. The ECC circuit can thus improve the reliability of the FeRAM.

However, it takes appropriate time to perform an error correcting operation in the ECC circuit. The following problem therefore occurs. When data is written back after its error is corrected, time required for writing back the data, including time required for correcting the error, is lengthened. In other words, when data is written back in accordance with the results of error correction in the ECC circuit, the results of error correction can be reflected in the data write-back operation, but cycle time is lengthened.

When data "0" is written first and then data "1" is done as a data write-back operation, the error correction in the ECC circuit has only to be completed at least by the end of writing of data "0" in order to reflect the results of the error correction. In other words, if time required for the error correction is shorter than that required for writing data "0," the results of the error correction can be reflected in the writing of data "1" without lengthening cycle time. If, however, time required for the error correction is longer than that required for writing data "0," the cycle time is lengthened accordingly.

As a technique related to the above, there is proposed a technique of improving the precision of detection of errors of data (see, for example, Jpn. Pat. Appln. KOKAI Publication No. 11-16389).

BRIEF SUMMARY OF THE INVENTION

According to an aspect of the present invention, there is provided a semiconductor memory device comprising a memory cell including a ferroelectric capacitor and a cell transistor and storing binary data at a first potential level and a second potential level which is higher than the first potential level, a bit line which reads the binary data out of the memory cell, a correction circuit which corrects an error of the binary data read out of the memory cell via the bit line, a setting circuit which sets to the first potential a potential of the bit line connected to the memory cell from which at least the binary data is read, after the binary data is transferred to the correction circuit, and a control circuit which controls the potential of the bit line connected to the memory cell from which the binary data is read, in accordance with a result of error correction of the binary data in the correction circuit.

BRIEF DESCRIPTION OF THE SEVERAL VIEWS OF THE DRAWING

FIG. 3 is a circuit diagram of a ferroelectric random access memory having an ECC circuit according to a second embodiment of the present invention;

FIG. 4 is a timing chart illustrating a data read operation of the ferroelectric random access memory shown in FIG. 3;

DETAILED DESCRIPTION OF THE INVENTION

Embodiments of the present invention will be described with reference to the accompanying drawings. It should be noted that the drawings are schematic ones and the dimension ratios shown therein are different from the actual ones. The dimensions vary from drawing to drawing and so do the ratios of dimensions.

First Embodiment

Figure 1:
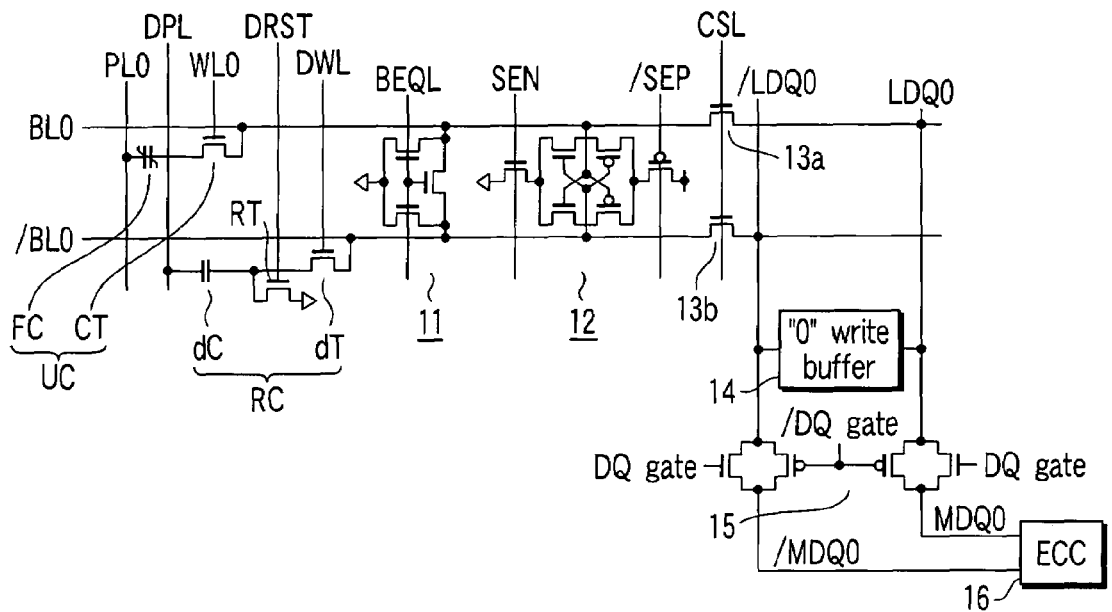
FIG. 1 is a circuit diagram of a ferroelectric random access memory having an ECC circuit according to a first embodiment of the present invention.

FIG. 1 shows a basic configuration of a semiconductor memory device according to a first embodiment of the present invention. The first embodiment is directed to a ferroelectric random access memory (FeRAM) having an ECC circuit, from which data is read by a 1T/1C system. For the sake of brevity, FIG. 1 shows one pair of bit lines only.

Referring to FIG. 1, a unit cell (FeRAM cell) UC serving as a memory cell is connected to one (BL0) of paired bit lines (a pair of bit lines) BL. The unit cell UC nonvolatilely stores binary data such as data "0" (e.g., first potential level) and data "1" (e.g., second potential level which is higher than the first potential level).

The unit cell UC includes a cell transistor CT and a ferroelectric capacitor FC. The gate electrode of the cell transistor CT is connected to a word line WL (WL0) and the source terminal thereof is connected to one (BL0) of the bit lines BL. One of electrodes of the ferroelectric capacitor FC is connected to the drain terminal of the cell transistor CT, and the other electrode thereof is connected to a plate line PL (PL0).

A reference cell RC is connected to the other bit line (/BL0). The reference cell RC includes a dummy transistor dT and a dummy capacitor dC. The gate electrode of the dummy transistor dT is connected to a dummy word line DWL, and the source terminal thereof is connected to the bit line /BL0. One of electrodes of the dummy capacitor dC is connected to the drain terminal of the dummy transistor dT, and the other electrode thereof is connected to a dummy plate line DPL.

A reset transistor RT is connected to the reference cell RC. The gate electrode of the reset transistor RT is connected to a dummy reset line DRST. The drain terminal thereof is connected to a node between the drain terminal of the dummy transistor dT and the one of the electrodes of the dummy capacitor dC. The source terminal thereof is grounded (connected to, e.g., a first potential level VSS).

One unit cell UC is formed by connecting a cell transistor CT and a ferroelectric capacitor FC together in series. A plurality of unit cells UC, which are connected to one of the bit lines BL, and a plurality of reference cells RC, which are connected to the other bit line, are arranged two-dimensionally to configure a large-capacity memory cell array (not shown).

A precharge circuit 11 is connected to the paired bit lines BL0 and /BL0, as is a sense amplifier 12. The precharge circuit 11 sets the potentials of the bit lines BL0 and /BL0 to VSS in response to the potential level of signal line BEQL. The sense amplifier 12 amplifies data supplied to the bit lines BL0 and /BL0 in response to the potential levels of sense amplifier driving signal lines SEN and /SEP.

Local data lines LDQ0 and /LDQ0 are connected to the bit lines BL0 and /BL0 via connection selecting transistors 13a and 13b, respectively. The selecting transistor 13a is a switch for selectively connecting the bit line BL0 and local data line LDQ0 to each other and disconnecting them from each other in response to the potential level of a signal line CSL. The selecting transistor 13b is a switch for selectively connecting the bit line /BL0 and local data line /LDQ0 to each other and disconnecting them from each other in response to the potential level of the signal line CSL.

A "0" write circuit ("0" write buffer) 14 is connected to the local data lines LDQ0 and /LDQ0. The "0" write circuit 14 transfers data to an ECC circuit (described later) and then sets to VSS the potential of the bit line BL0 connected to the unit cell UC from which the data is read.

Main data lines MDQ0 and /MDQ0 are connected to their respective local data lines LDQ0 and /LDQ0 via a pass gate circuit 15. The pass gate circuit 15 is a switch for selectively connecting the local data line LDQ0 and main data line MDQ0 to each other and disconnecting them from each other in response to the potential level of DQgate and also selectively connecting the local data line /LDQ0 and main data line /MDQ0 to each other and disconnecting them from each other in response to the potential level of DQgate.

An ECC circuit (correction circuit) 16 is connected to the main data lines MDQ0 and /MDQ0. The ECC circuit 16 checks whether a plurality of data items read out of the unit cell UC include error data and correct error data if any. If error data is read out with a certain probability, the ECC circuit 16 can correct the error data, thereby improving the reliability of the memory.

The ECC circuit 16 chiefly includes a parity computation circuit, a syndrome computation circuit and a data correction circuit (none of which are shown). The ECC circuit 16 compares a parity signal and data which are stored in separate memories, and detects error data in the read data. The more the amount of information (the number of data items) corresponding to a 1-bit parity signal, the lower the proportion of the parity signal to the memory capacity. More data is read out accordingly. The ECC circuit 16 corrects error data and outputs part of the error-corrected data. In burst mode, all data may be read out.

In write mode, a read operation is performed before a write operation. A parity signal and read data are input to the syndrome computation circuit. The syndrome computation circuit computes a syndrome signal and then the data correction circuit corrects error data in the read data. When the amount of data corresponding to the parity signal is larger than that of write data, part of the read data is rewritten as write data and then the parity computation circuit generates a new parity signal. Part of the corrected read data, the write data, and the parity signal are written to the memory cell.

In read mode, a parity signal and read data are input to the syndrome computation circuit to generate a syndrome signal. The data correction circuit checks whether the read data includes error data using the syndrome signal and corrects error data if any. The ECC circuit outputs part of the corrected error data to write back the data.

Figure 2:
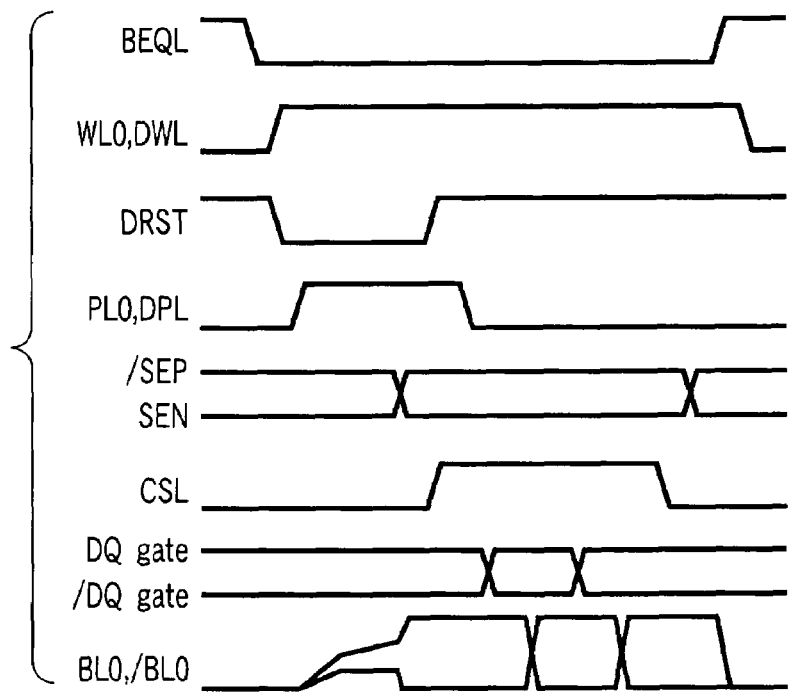
FIG. 2 is a timing chart illustrating a data read operation of the ferroelectric random access memory shown in FIG. 1.

An operation of the above FeRAM having an ECC circuit will be described. FIG. 2 shows the sequence of data read operations of the FeRAM. In read mode, as shown in FIG. 2, the potential level of signal line BEQL of the precharge circuit 11 for precharging the potentials of bit lines BL0 and /BL0 with VSS is set low (L) to bring the bit lines BL0 and /BL0 into floating state. After that, in order to read data out of a selected unit cell UC, the potential of a corresponding word line WL0 is set high (H) to connect the unit cell UC with the bit line BL0.

The potential level of a reset line DRST for precharging with VSS the bit line /BL0 side node of a reference cell RC to which a reference potential is applied is set low to bring the bit line /BL0 into floating state. After that, the potential of the dummy word line DWL is set high to connect the reference cell RC to the bit line /BL0.

The potential of each of the plate lines PL0 and DPL is set at VAA (bit line amplification voltage) which is the second potential level. Thus, the voltage VAA is applied to the unit cell UC and the reference cell RC to supply data from the unit cell UC to the bit line BL0 and supply data from the reference cell RC to the bit line /BL0.

After that, the sense amplifier 12 compares and amplifies the potentials of the bit lines BL0 and /BL0 by activating the sense amplifier driving signal lines SEN and /SEP. Assuming here that the data of the unit cell UC is "1" that is the second potential level, the potential of the bit line BL0 is VAA and that of the bit line /BL0 is VSS.

After that, the potential level of the signal line CSL becomes high, and the potential VAA of the bit line BL0 is transferred to the local data line LDQ0 through the selecting transistor 13a. The potential VAA is then transferred to the ECC circuit 16 through the main data line MDQ0. Then, the pass gate circuit 15 that connects the local data line LDQ0 and main data line MDQ0 and connects the local data line /LDQ0 and main data line /MDQ0 is shut off (in this case the potential level of signal line DQgate is low and that of signal line /DQgate is high). Thus, the data of the unit cell UC is maintained by the ECC circuit 16. The potential level of the signal line CSL becomes high and then the potential of each of the plate lines PL0 and DPL becomes low.

After that, the "0" write circuit 14 sets to VSS the potential of the bit line BL0 to which the unit cell UC is connected (the potential of the bit line /BL0 is VAA (VAA>VSS)). If the data of the unit cell UC sent to the ECC circuit 16 is error data, the ECC circuit 16 outputs it as highlighted one. If not, the ECC circuit 16 writes the potential of the bit line BL0 back to VAA and rewrites (restores) data "1" to (in) a corresponding unit cell UC.

In the prior art FeRAM, the potential of the plate line PL0 has to be maintained at a high level in data read mode. In the first embodiment, it is possible to wait for the completion of error correction in the ECC circuit 16 while the potential of the plate line PL0 is low. Since time required for the error correction can be lengthened, data can be written back to a unit cell UC without lengthening cycle time.

As described above, when the transfer of data read out of a unit cell UC to the ECC circuit 16 is completed, data "0" is temporarily written to the unit cell UC. Only in the case where data "1" needs to be written when error correction is completed in the ECC circuit 16, data "1" is rewritten. If data "0" is written first and then data "1" is done for a data write-back operation, the results of error correction can be reflected in the data write-back operation without lengthening cycle time. Consequently, data can be written back with high efficiency, and cycle time required for the data write-back operation can be shortened.

The above first embodiment is directed to a ferroelectric random access memory (FeRAM) having an ECC circuit from which data is read by a 1T/1C system. However, the present invention can be applied to a ferroelectric random access memory (FeRAM) having an ECC circuit from which data is read by a 2T/2C system.

Second Embodiment

FIG. 3 shows a basic configuration of a semiconductor memory device according to a second embodiment of the present invention. The second embodiment is directed to a ferroelectric random access memory (FeRAM) having an ECC circuit from which data is read by a 2T/2C system. For the sake of brevity, FIG. 3 shows one pair of bit lines only. The same components as those of FIG. 1 are denoted by the same reference numerals and their detailed descriptions are omitted.

The second embodiment differs from the first embodiment in that not a reference cell but a data cell (memory cell) is connected to one of the bit lines and no "0" write circuit is connected to a local data line. As show in FIG. 3, a unit cell UC serving as a memory cell is connected to one (BL0) of paired bit lines BL. A data cell DC for holding complementary data is connected to the other (/BL0) of the bit lines BL. The data cell DC includes a cell transistor CT and a ferroelectric capacitor FC. The gate electrode of the cell transistor CT is connected to a word line WL (/WL0) and the source terminal thereof is connected to the other bit line /BL0. One of electrodes of the ferroelectric capacitor FC is connected to the drain terminal of the cell transistor CT, and the other electrode is connected to a plate line PL (/PL0).

A plurality of unit cells UC, which are connected to one of the bit lines BL and a plurality of data cells DC, which are connected to the other bit line, are arranged two-dimensionally to configure a large-capacity memory cell array (not shown).

A precharge circuit 11 and a sense amplifier 12 are each connected to the bit lines BL0 and /BL0 as a setting circuit. Local data lines LDQ0 and /LDQ0 are connected to the bit lines BL0 and /BL0 via connection selecting transistors 13a and 13b, respectively. Main data lines MDQ0 and /MDQ0 are connected to their respective local data lines LDQ0 and /LDQ0 via a pass gate circuit 15. An ECC circuit (correction circuit) 16 is connected to the main data lines MDQ0 and /MDQ0.

An operation of the above FeRAM having an ECC circuit will be described. FIG. 4 shows the sequence of data read operations of the FeRAM. In read mode, as shown in FIG. 4, the potential level of signal line BEQL of the precharge circuit 11 for precharging the potentials of bit lines BL0 and /BL0 with VSS is set low (L) to bring the bit lines BL0 and /BL0 into floating state. After that, in order to read data out of a selected unit cell UC, the potentials of corresponding word lines WL0 and /WL0 are set high (H) to connect the unit cell UC with the bit line BL0 and the data cell DC with the bit line /BL0. The data cell DC connected to the bit line /BL0 holds data complementary to the data of the unit cell UC connected to the bit line BL0.

The potential of each of the plate lines PL0 and /PL0 is set at VAA (bit line amplification voltage) which is the second potential level. Thus, the voltage VAA is applied to the unit cell UC and the data cell DC to supply data from the unit cell UC to the bit line BL0 and read data from the data cell DC to the bit line /BL0.

After that, the sense amplifier 12 compares and amplifies the potentials of the bit lines BL0 and /BL0 by activating the sense amplifier driving signal lines SEN and /SEP. Assuming here that the data of the unit cell UC is "1" that is the second potential level, the potential of the bit line BL0 is VAA and that of the bit line /BL0 is VSS (VAA>VSS).

After that, the potential level of the signal line CSL becomes high, and the potential VAA of the bit line BL0 is transferred to the local data line LDQ0 through the selecting transistor 13a. The potential VAA is then transferred to the ECC circuit 16 through the main data line MDQ0. The pass gate circuit 15 that connects the local data line LDQ0 and main data line MDQ0 and connects the local data line /LDQ0 and main data line /MDQ0 is shut off (in this case the potential level of signal line DQgate is low and that of signal line /DQgate is high). Thus, the data of the unit cell UC is maintained by the ECC circuit 16. The potential level of the signal line CSL becomes high and then the potential of each of the plate lines PL0 and /PL0 becomes low.

After that, unlike in the first embodiment, the sense amplifier driving signal lines SEN and /SEP are inactivated and the potential level of the signal line BEQL is set high, thereby setting the potential of each of the bit lines BL0 and /BL0 to VSS by the precharge circuit 11. If the data of the unit cell UC sent to the ECC circuit 16 is error data, it is written back such that the potential of the bit line /BL0 becomes high. If not, it is written back such that the potential of the bit line BL0 becomes high.

In the prior art FeRAM, the potentials of the plate lines PL0 and /PL0 have to be maintained at a high level in data read mode. In the second embodiment of the present invention, it is possible to wait for the completion of error correction in the ECC circuit 16 while the potentials of the plate lines PL0 and /PL0 are set low. In other words, time required for the error correction can be lengthened and thus data can be written back to a unit cell UC without lengthening cycle time.

As described above, the 2T/2C data read type FeRAM having an ECC circuit according to the second embodiment allows data to be written back with high efficiency and allows cycle time for the write-back operation to be shortened. In this FeRAM, when the transfer of data read out of a unit cell UC to the ECC circuit 16 is completed, the precharge circuit 11 can temporarily write data "0" to the unit cell UC and data cell DC.

In the foregoing second embodiment, the connection of the local data line LDQ0 and main data line MDQ0 is controlled by the pass gate circuit 15, as is the connection of the local data line /LDQ0 and main data line /MDQ0. In the 2T/2C data read type FeRAM, the pass gate circuit 15 can be omitted.

Third Embodiment

Figure 5:
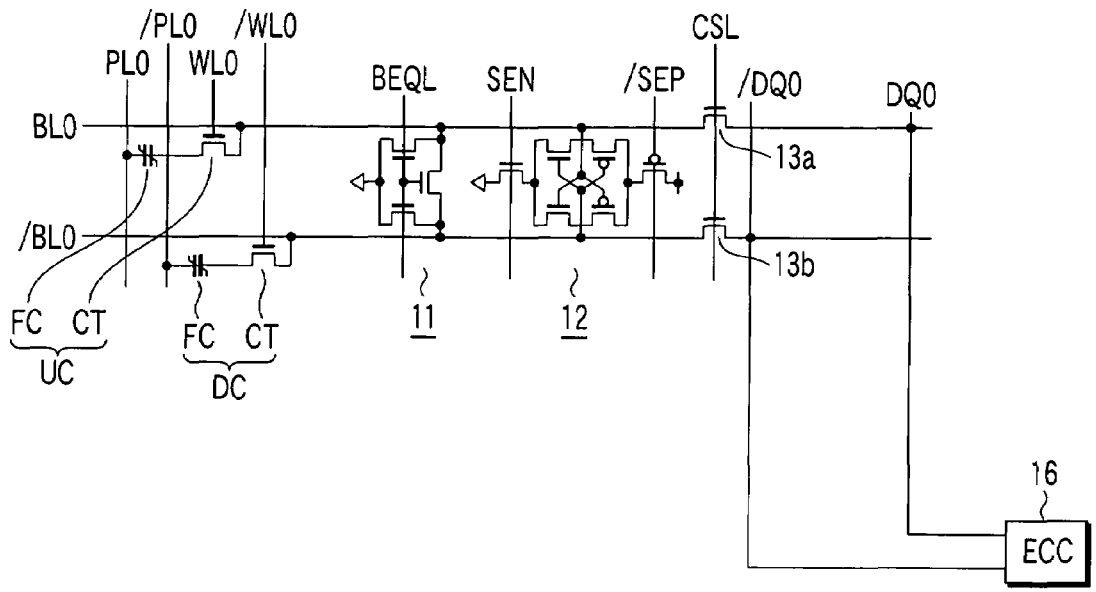
FIG. 5 is a circuit diagram of a ferroelectric random access memory having an ECC circuit according to a third embodiment of the present invention.

FIG. 5 shows a basic configuration of a semiconductor memory device according to a third embodiment of the present invention. The third embodiment is directed to a ferroelectric random access memory (FeRAM) having an ECC circuit from which data is read by a 2T/2C system. For the sake of brevity, FIG. 5 shows one pair of bit lines only. The same components as those of FIG. 3 are denoted by the same reference numerals and their detailed descriptions are omitted.

The third embodiment differs from the second embodiment in that there is no pass gate circuit for controlling a local data line and a main data line. As show in FIG. 5, a unit cell UC serving as a memory cell is connected to one (BL0) of paired bit lines BL, and a data cell DC for holding complementary data is connected to the other (/BL0) of the bit lines BL.

A plurality of unit cells UC, which are connected to one of the bit lines BL, and a plurality of data cells DC, which are connected to the other bit line, are arranged two-dimensionally to form a large-capacity memory cell array (not shown).

A precharge circuit 11 and a sense amplifier 12 are each connected to the bit lines BL0 and /BL0 as a setting circuit. Data lines DQ0 and /DQ0 are connected to the bit lines BL0 and /BL0 via connection selecting transistors 13a and 13b, respectively. An ECC circuit (correction circuit) 16 is connected to the data lines DQ0 and /DQ0.

Figure 6:
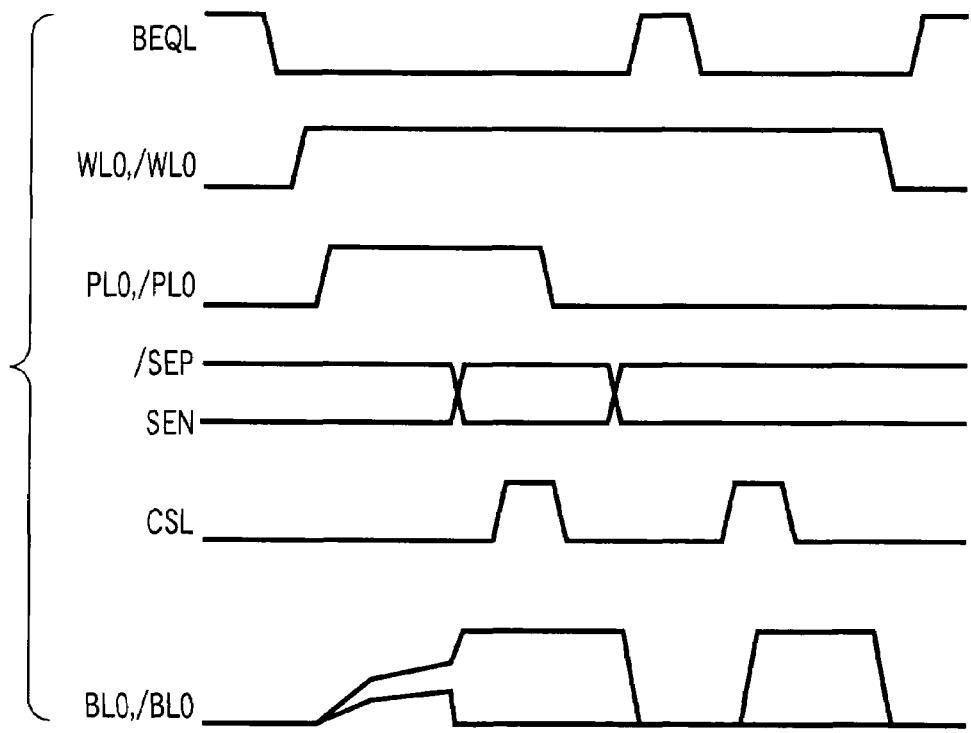
FIG. 6 is a timing chart illustrating a data read operation of the ferroelectric random access memory shown in FIG. 5.

An operation of the above FeRAM having an ECC circuit will be described. FIG. 6 shows the sequence of data read operations of the FeRAM. In read mode, as shown in FIG. 6, the potential level of signal line BEQL of the precharge circuit 11 for precharging the potentials of bit lines BL0 and /BL0 with VSS is set low (L) to bring the bit lines BL0 and /BL0 into floating state. After that, in order to read data out of a selected unit cell UC, the potentials of corresponding word lines WL0 and /WL0 are set high (H) to connect the unit cell UC with the bit line BL0 and connect the data cell DC with the bit line /BL0. The data cell DC connected to the bit line /BL0 holds data complementary to the data of the unit cell UC connected to the bit line BL0.

The potential of each of the plate lines PL0 and /PL0 is set at VAA (bit line amplification voltage) which is the second potential level. Thus, the voltage VAA is applied to the unit cell UC and the data cell DC to read data from the unit cell UC to the bit line BL0 and read data from the data cell DC to the bit line /BL0.

After that, the sense amplifier 12 compares and amplifies the potentials of the bit lines BL0 and /BL0 by activating the sense amplifier driving signal lines SEN and /SEP. Assuming here that the data of the unit cell UC is "1" that is the second potential level, the potential of the bit line BL0 is VAA and that of the bit line /BL0 is VSS.

After that, the potential level of the signal line CSL becomes high, and the potential VAA of the bit line BL0 is transferred to the data line DQ0 through the selecting transistor 13a. The potential VAA is then transferred to the ECC circuit 16 through the data line DQ0. The selecting transistor 13a that connects the bit line BL0 and data line DQ0 and the selecting transistor 13b that connects the bit line /BL0 and data line /DQ0 are turned off (in this case the potential level of signal line CSL is low). Thus, the data of the unit cell UC is maintained by the ECC circuit 16. When the potential level of the signal line CSL becomes low, the potential of each of the plate lines PL0 and /PL0 becomes low.

Unlike in the first embodiment, the sense amplifier driving signal lines SEN and /SEP are inactivated, and the potential level of the signal line BEQL is set high, thereby setting the potential of each of the bit lines BL0 and /BL0 to VSS by the precharge circuit 11. If the data of the unit cell UC sent to the ECC circuit 16 is error data, it is written back such that the potential of the bit line /BL0 becomes high. If not, it is written back such that the potential of the bit line BL0 becomes high.

A transmission path can be disconnected from the ECC circuit 16 (the data lines DQ0 and /DQ0 can be disconnected from each other) even by turning off the selecting transistors 13a and 13b under the control of the signal line CSL. Even when a pass gate circuit is omitted, it is possible to wait for the completion of error correction of the ECC circuit 16 while the potentials of the bit lines BL0 and /BL0 are at VSS, without having an influence on the data held by the ECC circuit 16.

The above first to third embodiments are directed to one unit cell. The present invention is not limited to this, but can be applied to a so-called chain-structure FeRAM in which a plurality of unit cells are connected like a chain.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell including a ferroelectric capacitor and a cell transistor and storing binary data at a first potential level and a second potential level which is higher than the first potential level;
   a bit line which reads the binary data out of the memory cell;
   a correction circuit which corrects an error of the binary data read out of the memory cell via the bit line;
   a setting circuit which sets to the first potential a potential of the bit line connected to the memory cell from which the binary data is once read, after the binary data is transferred to the correction circuit; and
   a control circuit which controls the potential of the bit line connected to the memory cell from which the binary data is read, in accordance with a result of error correction of the binary data in the correction circuits,
   wherein the control circuit sets the potential of the bit line connected to the memory cell from which the binary data is read at the second potential level when the result of error correction corresponds to the second potential level.

2. The semiconductor memory device according to claim 1, wherein the bit line includes a pair of bit lines and, when the memory cell is connected to one of the bit lines and a reference cell which applies a reference potential is connected to other of the bit lines, the setting circuit sets a potential of the one of the bit lines to VSS.

3. The semiconductor memory device according to claim 1, wherein the bit line includes a pair of bit lines and, when the memory cell is connected to one of the bit lines and a reference cell which applies a reference potential is connected to other of the bit lines, the setting circuit sets a potential of the other of the bit lines to VAA (VAA>VSS).

4. The semiconductor memory device according to claim 1, wherein the bit line includes a pair of bit lines and, when the memory cell is connected to one of the bit lines and a reference cell which applies a reference potential is connected to other of the bit lines, the control circuit applies a potential VAA to the one of the bit lines only if the binary data to be written back to the memory cell is "1" as the result of error correction in the correction circuit.

5. The semiconductor memory device according to claim 1, wherein the bit line includes a pair of bit lines and, when the memory cell is connected to one of the bit lines and a data cell which stores complementary data is connected to other of the bit lines, the setting circuit sets to VSS a potential of the one of the bit lines and a potential of the other of the bit lines.

6. The semiconductor memory device according to claim 1, wherein the bit line includes a pair of bit lines and, when the memory cell is connected to one of the bit lines and a data cell which stores complementary data is connected to other of the bit lines, the control circuit applies potential VAA to the one of the bit lines if the binary data to be written back to the memory cell is "1", as the result of error correction in the correction circuit.

7. The semiconductor memory device according to claim 1, wherein the bit line includes a pair of bit lines and, when the memory cell is connected to one of the bit lines and a data cell which stores complementary data is connected to other of the bit lines, the control circuit applies potential VAA to the other of the bit lines if the binary data to be written back to the memory cell is "0" as the result of error correction in the correction circuit.

8. The semiconductor memory device according to claim 1, wherein the memory cell is configured by connecting the ferroelectric capacitor and the cell transistor in series.

9. The semiconductor memory device according to claim 1, wherein the memory cell stores the binary data nonvolatilely according to amounts of different two polarizations of the ferroelectric capacitor.

10. The semiconductor memory device according to claim 1, wherein read of the binary data out of the memory cell is destructive read by polarization reversal.

11. The semiconductor memory device according to claim 1, wherein a plate line is connected to an end of the ferroelectric capacitor, which does not contact the cell transistor, and a potential of the plate line is maintained at a low level until the correction circuit completes the error correction of the binary data.

12. The semiconductor memory device according to claim 1, wherein the correction circuit is an error checking and correcting circuit.

13. The semiconductor memory device according to claim 1, wherein the setting circuit sets the potential of the bit line to the first potential level while a data line that connects the correction circuit with the bit line connected to the memory cell is shut off by a pass gate circuit after the binary data is transferred to the correction circuit.

14. The semiconductor memory device according to claim 13, wherein the setting circuit is a write circuit which writes data "0" to the memory cell.

15. The semiconductor memory device according to claim 13, wherein the setting circuit is a precharge circuit which precharges the potential of the bit line.

16. The semiconductor memory device according to claim 1, wherein the setting circuit sets the potential of the bit line to the first potential level while the bit line connected to the memory cell is disconnected from a data line connected to the correction circuit by a connection selecting transistor after the binary data is transferred to the correction circuit.

17. The semiconductor memory device according to claim 16, wherein the setting circuit is a precharge circuit which precharges the potential of the bit line.

18. The semiconductor memory device according to claim 1, wherein the bit line includes a pair of bit lines, and a sense amplifier is connected to each of the bit lines.

* * * * *